United States Patent [19]

Yonehara

[11] Patent Number: 5,423,286
[45] Date of Patent: Jun. 13, 1995

[54] METHOD FOR FORMING CRYSTAL AND CRYSTAL ARTICLE

[75] Inventor: Takao Yonehara, Atsugi, Japan

[73] Assignee: Canon Kabushiki Kaisha, Tokyo, Japan

[21] Appl. No.: 246,558

[22] Filed: May 19, 1994

Related U.S. Application Data

[63] Continuation of Ser. No. 12,796, Jan. 28, 1993, abandoned, which is a continuation of Ser. No. 798,342, Nov. 20, 1991, abandoned, which is a continuation of Ser. No. 501,845, Mar. 30, 1990, abandoned.

[30] Foreign Application Priority Data

Mar. 31, 1989 [JP] Japan .................. 1-81104

[51] Int. Cl.$^6$ .......................... C30B 25/04
[52] U.S. Cl. ................. 117/94; 117/90; 117/95; 117/96; 117/106
[58] Field of Search .......... 437/38, 93; 117/94, 117/95, 96, 106, 90

[56] References Cited

U.S. PATENT DOCUMENTS

| | | | |
|---|---|---|---|
| 3,585,088 | 6/1971 | Schwattke et al. | 437/83 |
| 3,620,833 | 11/1971 | Gleim et al. | 437/83 |
| 4,333,792 | 6/1982 | Smith | 156/DIG. 88 |
| 4,371,421 | 2/1983 | Fan et al. | 156/DIG. 88 |
| 4,383,883 | 5/1983 | Mitutani | 156/DIG. 102 |
| 4,657,603 | 4/1987 | Kruehler et al. | 437/83 |
| 4,670,088 | 5/1987 | Tsaur et al. | 156/620.71 |
| 4,749,660 | 6/1988 | Short et al. | 437/83 |
| 4,800,527 | 1/1989 | Ozaki et al. | 365/182 |

FOREIGN PATENT DOCUMENTS

| | | | |
|---|---|---|---|
| 1139453 | 1/1983 | Canada | 437/83 |
| 244081 | 11/1987 | European Pat. Off. | 156/610 |
| 57-95619 | 6/1982 | Japan | 437/83 |
| 63-107016 | 5/1988 | Japan . | |

OTHER PUBLICATIONS

T. Yonehara, et al., Applied Physics Letters, vol. 52, No. 15 (Apr. 11, 1988) pp. 1231–1233.
H. I. Smith, et al., Applied Physics Letters vol. 32, No. 6 (Mar. 15, 1978) pp. 349–350.
T. Yonehara, et al., Applies Physics Letters, vol. 45, No. 6 (Sep. 15, 1984) pp. 631–632.
M. W. Geis, et al., Applied Physics Letters, vol. 35, No. 1 (Jul. 1, 1979) pp. 71–74.
D. A. Porter, et al., "Phase Transformations in Metals and Alloys," Van Nostrond (International), Wokingham, GB (1981) pp. 193–194.
M. C. Flemmings, "Solidification Processing," McGraw-Hill, New York (1974) pp. 290–327.

*Primary Examiner*—Robert Kunemund
*Attorney, Agent, or Firm*—Fitzpatrick, Cella, Harper & Scinto

[57] ABSTRACT

A method for forming a crystal comprises applying a crystal growth treatment to a substrate comprising:
a non-nucleation surface; and
a nucleation surface constituted of an amorphous material with a higher nucleation density than said non-nucleation surface, having a sufficiently small area so as to form only a single nucleus from which a single crystal is grown, and having regular anisotropy.

Also a crystal article is formed by said method for forming a crystal.

4 Claims, 1 Drawing Sheet

METHOD FOR FORMING CRYSTAL AND CRYSTAL ARTICLE

This application is a continuation of application Ser. No. 08/012,796, filed Jan. 28, 1993, now abandoned, which is a continuation of application Ser. No. 07/798,342, filed Nov. 20, 1991, now abandoned, which is a continuation of application Ser. No. 07/501,845, filed Mar. 30, 1990, now abandoned.

BACKGROUND OF THE INVENTION

1. Field of the Invention

This invention relates to a crystal article and a method for forming a crystal, particularly to a method for forming a crystal utilizing the difference in nucleation density of the deposited materials according to the kinds of the materials of the deposited surface and a crystal article.

The present invention can be applied to, for example, electronic devices, optical devices, magnetic devices, piezoelectric devices or surface acoustic devices such as semiconductor integrated circuits, optical integrated circuits, magnetic circuits, etc.

2. Related Background Art

In the prior art, single crystal thin films to be used for semiconductor electronic devices or optical devices have been formed by epitaxial growth on a single crystalline substrate.

For example, it has been known to effect epitaxial growth of Si, Ge, GaAs, etc. from liquid phase, gas phase or solid phase on a Si single crystalline substrate (silicon wafer), and also it had been known to effect epitaxial growth of a single crystal of GaAs, GaAlAs, etc. on a GaAs single crystalline substrate.

By use of such semiconductor thin film thus formed, semiconductor devices and integrated circuits, light emission devices such as semiconductor lasers, LED are prepared.

Also, recently, research and development on ultra-high speed transistors by using a two-dimensional electronic gas and ultra-lattice devices utilizing quantum well, has been active. What has enabled these developments the high precision epitaxial technique such as MBE (molecular beam epitaxy) by use of ultra-high vacuum or MOCVD (metal organic chemical vapor deposition method), etc.

In such epitaxial growth on a single crystal substrate, it is necessary to matching the lattice constant and thermal expansion coefficient between the single crystalline material of the substrate and the epitaxial growth layer.

For example, although it is possible to effect epitaxial growth of a Si single crystalline thin film on a sapphire which is an insulating single crystal substrate, there have been the problems such as crystal lattice defect at the interface due to slippage in lattice constants and diffusion of aluminum, which is a component of sapphire, into the epitaxial layer in application to electronic devices and circuits.

Thus, it can be understood that the method of forming a single crystalline thin film of the prior art by epitaxial growth depends greatly on its substrate material. Mathews et al examined combinations of substrate materials and epitaxial growth layers (EPITAXIAL GROWTH, Academic Press, New York, 1975 edited by J. W. Mathews).

Also, the size of the substrate is presently about 6 inches in the case of Si wafer, and enlargement of GaAs, sapphire substrate is more limited.

Further, a single crystalline substrate is high in production cost, and therefore the cost per chip becomes higher.

Thus, for formation of a single crystalline layer capable of forming a device of good quality according to the method of the prior art, there has been the problem that the substrate material is limited to a very narrow range.

On the other hand, research and development have been active in recent years on three-dimensional integrated circuits which accomplish higher integration and multi-function by laminating semiconductor devices in the normal line direction of the substrate.

Also, research and development of large area semiconductor devices are becoming more active year by year such as solar batteries having devices arranged in an array on an inexpensive glass, picture element switching transistors of liquid crystal, etc.

What is common to both of research does not exist the technique of forming a semiconductor thin film on ale non-amorphous insulating material and forming an electronic device such as transistor thereon. Among them, particularly, it has been desired to have a technique for forming a single crystalline semiconductor of high quality on an amorphous insulating material.

Generally, speaking, when a thin film is deposited on an amorphous insulating material substrate such as $SiO_2$, due to deficiency of long distance order of the substrate material, the crystal structure of the deposited film becomes amorphous or polycrystalline (here amorphous film refers to the state where short distance order to the closest extent is preserved but not longer distance order exists, and polycrystalline film refers to a mass of single crystals having no specific crystal direction separated through grain boundaries).

For example, when Si is formed on $SiO_2$ by CVD method, there is a tendency such that, if the deposition temperature is about 600° C. or lower it becomes amorphous silicon, while if the temperature is higher than that, a polycrystalline silicon with particle sizes of some hundred to some thousand angstroms is obtained. However, the particle size of the polycrystalline silicon varies depending on the formation conditions.

Further, by melting and solidifying the amorphous or polycrystalline film by an energy beam such as laser or rod-shaped heater, a polycrystalline thin film with a grain size of about microns or millimeters has been prepared (Single-Crystal silicon on non-single-crystal insulators, Journal of Crystal Growth, vol. 63, No. 3, October, 1983, edited by G. W. Cullen).

By forming transistors on thin films of various crystal structures thus formed and measuring electron mobilities mobility of about 0.1 $cm^2$/V-sec is obtained in amorphous silicon, about 1 to 10 $cm^2$/V-sec in a polycrystalline silicon having grain sizes of some hundred angstroms, and mobility to the same extent as in the case of single crystalline silicon in a polycrystalline silicon with large grain sizes by melting solidification.

From these results, it can be understood that there is a great difference in their electrical characteristics between the device formed in a single crystal region within the crystal grain and the device formed as bridging over grain boundary.

More specifically, the deposited film on an amorphous substrate surface has an amorphous or polycrystalline structure, and the device prepared from it is greatly inferior in its performance as compared with the device prepared on the single crystalline layer. For this reason, its is use limited to such as simple switching devices, solar battery, photoelectric converting device, etc.

The methods for depositing crystal layers on an amorphous substrate may be broadly classified into two methods.

One is to use a single crystal (e.g. Si) as the substrate, cover an amorphous insulating material (e.g. $SiO_2$), remove a part thereof to have the subbing single crystalline surface. The exposed portion is used as the seed crystal for epitaxial growth from gas phase, solid phase or liquid phase and further epitaxial growth in the lateral direction, thereby forming a single crystal region on the amorphous insulating material layer (so called selective epitaxial growth).

The other is to utilize natural nucleus generation without use of a single crystal for the subbing substrate, thereby growing a polycrystalline thin layer.

As described above, there is no long distance order on an amorphous substrate surface as exists on a single crystalline substrate surface, but only short distance order is maintained.

For this reason, the structure of the thin film deposited as such is liable to become amorphous, and the position of grain boundary becomes at best disorderly polycrystalline.

Also, since not only there is no long distance order on the amorphous substrate surface, there is also no anisotropy defining the crystal direction (substrate normal line direction and interplanar direction), it has been impossible to control the crystal direction of the layer thereon.

To summarize the problems of the deposited layer on the amorphous substrate, there are only the controls of grain boundary position and crystal direction.

As to control of the grain boundary position, the present inventors formerly disclosed that the grain boundary position can be determined by previous artificial definition of the nucleation position (Japanese Patent Laid-open Application No. 63-107016), which was named Sentaxy (Selective Nucleation based Epitaxy) (T. Yonehara, Y. Nishigaki, H. Mizutani, S. Kondoh, K. Yamagata, T. Noma and T. Ishikawa, Applied Physics Letters vol. 12, pp. 1231, 1988).

By having fine amorphous $Si_3N_4$ localized on amorphous $SiO_2$ which portion becomes the nucleation surface wherefrom single crystals of Si grow, and through collision against the crystal from the adjoining nucleation surface, a grain boundary is formed to determine the grain boundary position.

However, its crystal direction, particularly the interplanar crystal direction cannot be determined singly, because $Si_3N_4$ which is the nucleation surface is amorphous and no anisotropy exists.

On the other hand, in 1978, H. I. Smith disclosed for the first time that by imparting artificial anisotropy with unevenness to the amorphous substrate surface by lithography, the crystal direction of KCl deposited thereon can be controlled, and named this method as Graphoepitaxy (H. I. Smith and D. C., Flanders, Applied Physics Letters. vol. 32, pp. 349, 1978) (H. I. Smith, U.S. Pat. No. 4,333,792, 1982).

Thereafter, it was confirmed that the artificial relief pattern on the substrate surface had influences on the crystal directions in both grain growth of Ge thin film (T. Yonchars, H. I. Smith, C. V. Thompson and J. E. Palmer, Applied Physics Letters vol. 45, pp. 631, 1984) and initial growth of Sn (L. S. Darken and D. H. Lowndere, Applied Physics Letters vol. 40, pp. 954, 1987).

However, in Graphoepitaxy, KCl, Sn were found to have effects of the direction in individual crystals separated at the initial stage of deposition thereof, but for a continuous layer, only crystal growth by laser annealing after deposition of Si (M. W. Gels, D. A. Flanders and H. I. Smith, Applied Physics Letters vol. 35, pp. 71, 1979) and solid phase growth of Ge (T. Yonehara, H. I. Smith, C. V. Thompson and J. E. Palmer, Applied Physics Letters vol. 45, pp. 631, 1984) have been reported.

However, in the case of Si and, Ge, although the direction can be controlled to some extent, the group of crystals are juxtaposed in mosaic shape. Further, randomly positioned grain boundaries different slightly in crystal direction mutually exist between the crystals, whereby no uniform single crystal could be obtained over large area.

The reason is that in addition to the fact that the three-dimensional crystal directions of the crystals are not completely coincident with each other, in the surface relief pattern, the nucleus generation position cannot be controlled. This fact has been found by the present inventors as the result of the studies for long years.

SUMMARY OF THE INVENTION

The method for forming a crystal of the present invention provides crystal growth from a single nucleus by use of a substrate having a nucleation surface which has regular anisotropy and a sufficiently fine area so as to form only a single nucleus from which a crystal is grown, and a non-nucleation surface with lower nucleation density than said nucleation surface.

The crystal product of the present invention provides a crystal grown from a single nucleus by use of a substrate having a nucleation surface which has regular anisotropy and is a sufficiently fine area so as to form only a single nucleus from which a crystal is grown, and a non-nucleation surface with lower nucleation density than said nucleation surface.

Another object of the present invention is to provide a method for forming a crystal, which enables formation of a single crystal controlled in direction on an amorphous insulating material substrate, with the resulting electronic device having by far remarkably higher performance as compared with one prepared on the amorphous or polycrystalline layer of the prior art.

Also, it is another object of the present invention to provide a crystal article which makes higher speed, or radiation resistance, reduction of the element separation region possible, by reduction of capacity components, since the subbing substrate is an insulating material.

Still another object of the present invention is to provide an inexpensive single crystal on a large area substrate without use of an expensive single crystal substrate.

According to the present invention, by arranging a nucleation surface comprising an amorphous material to which surface anisotropy has been artificially imparted, determining its crystal direction at the very initial stage of nucleus generation and permitting a crystal to grow while maintaining its crystal structure, a large area crystal region with regular directions can be formed.

Even if the interplanar directions may differ minutely between the group of individual crystals, since the grain boundary positions between the crystals differing slightly in crystal direction are determined in position at the middle between the respective nucleation surfaces, the grain boundary positions can be predicted. Therefore by arranging the device while avoiding the sites which become the obstacles for the electronic device, imparting a crystal portion in a concavity of the substrate or alternatively by removing the sites which become the obstacles by removal of the grain boundary portions after formation of grain boundaries, a single crystal region factually free from defects with grain boundaries can be obtained on the whole substrate.

It is very important in preparation of an electronic device that the crystal directions are regular. That is, variance in direction appears as variance in device characteristics due to dependency of carrier mobility on crystal directions.

Also, as to the random grain boundaries existing, even grain boundaries with crystals differing slightly in crystal direction may become obstacles to interfere with carrier running, thereby also becoming the cause for deterioration and variance of device characteristics.

Further, also during working such as oxidation or etching, the difference in crystal direction will bring about lowering in yield due to the direction dependency of the oxidation speed and the etching speed.

In addition, the grain boundaries become the routes for accelerated speed oxidation, accelerated speed diffusion, thereby bringing about deterioration of device characteristics again.

According to the present invention, a crystal region with large area with regular crystal directions can be realized, whereby an electronic device of extremely high performance equal to a device prepared on a bulk single crystal substrate can be prepared with little variance.

DETAILED DESCRIPTION OF EMBODIMENTS

For better understanding of the present invention, description is made by referring to FIG. 1.

Figure 1A:
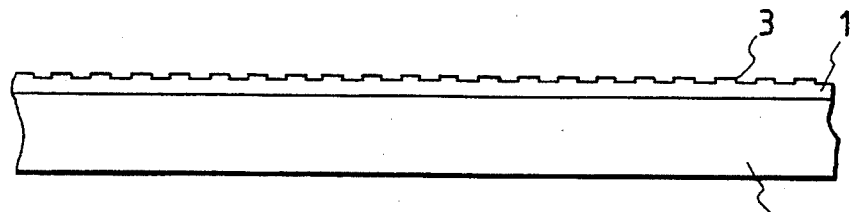
FIGS. 1A to 1D are schematic diagrams for illustrations of the steps of the present invention.

As shown in FIG. 1A, on the surface of a non-single crystalline substrate 2, a non-single crystalline substance 1 with higher nucleation density than the non-single crystalline substrate 2 is covered, and a regular step 3 is formed artificially on its surface.

Figure 1B:
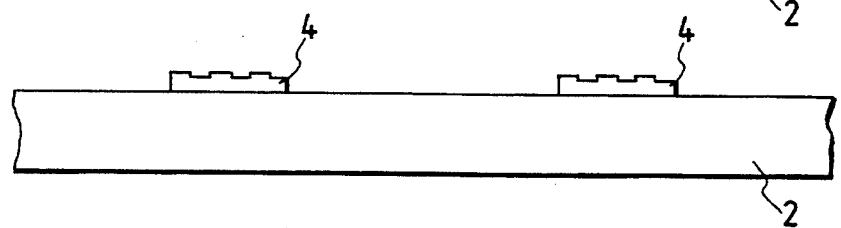

Then, as shown in FIG. 1B, a thin film 1 having high nucleation density is formed by fine patterning to form a nucleation surface 4.

As the step 3 to be provided on the nucleation surface 4, its width should be preferably 0.1 $\mu$m to 1.0 $\mu$m, more preferably 0.1 $\mu$m to 0.5 $\mu$m, with its depth being desirably 0.01 $\mu$m to 0.1 $\mu$m, more preferably 0.01 $\mu$m to 0.05 $\mu$m.

The size of the nucleation surface, for growing single crystals from the nucleation surface, may be desirably 10 $\mu$m or less, more preferably 5.0 $\mu$m or less, optimally 1.0 $\mu$m or less.

As the material constituting the nucleation surface, for example, a material having higher nucleation density relative to the crystal material to be grown such as silicon nitride, silicon excessive silicone oxide, etc. may be used.

Figure 1C:
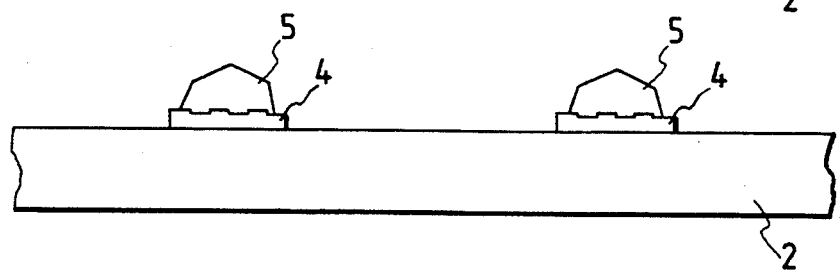

Since the nucleation surface is formed so finely that only a single crystal can be grown, as shown in FIG. 1C, the nucleus of the substance deposited appears on the nucleation surface 4, and a single crystal grows on each nucleation surface 4 via the complicated elimination, adsorption, integration, coarsening phenomena at the initial stage, with no deposition on the surfaces of other low nucleation substances 2 at all.

Besides, the directions of the crystals formed are regular not only in the substrate normal line direction but also in the interplanar direction.

When growth is further continued, the crystal region continues to be increased with the crystal 5 as the seed crystal, until it surpasses the nucleation surface 4 and continues to be grown on the non-deposition surface while maintaining the crystal direction and crystallinity at the initial stage. This growth of seed crystal may be called a kind of epitaxial growth.

Figure 1D:
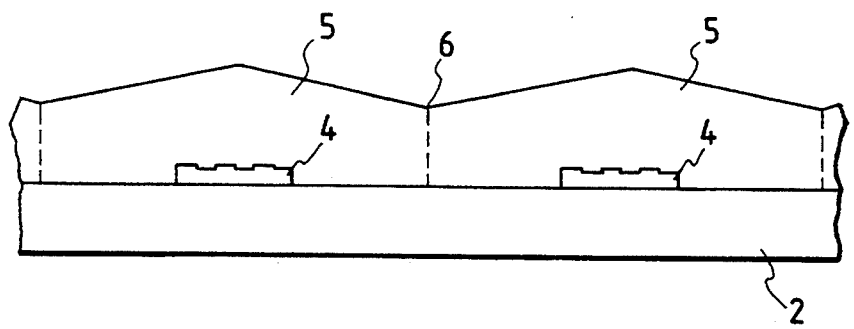

Finally, as shown in FIG. 1D, the crystal 5 is collided against the crystal grown from the adjoining nucleation surface 4 at the intermediate position between the nucleation surface 4.

If the crystal directions are completely coincident between the both crystals, the lattices of both the crystals are matched to give no defect at the collided position at the bonded portion between the crystals. But when there is a change in step angle of the artificial relief, a slippage occurs in the crystal direction of the crystal grown. As the result, as shown in FIG. 1D, a grain boundary 6 with the crystals differing slightly in crystal direction is caused to occur in the middle between the nucleation surfaces.

Since the growth speeds of both crystals are equal, the grain boundary 6 with the crystals differing slightly in crystal direction is constantly defined at the central portion between the nucleation surface 4, and the position can be previously predicted and avoided during preparation of the device.

Figure 2:
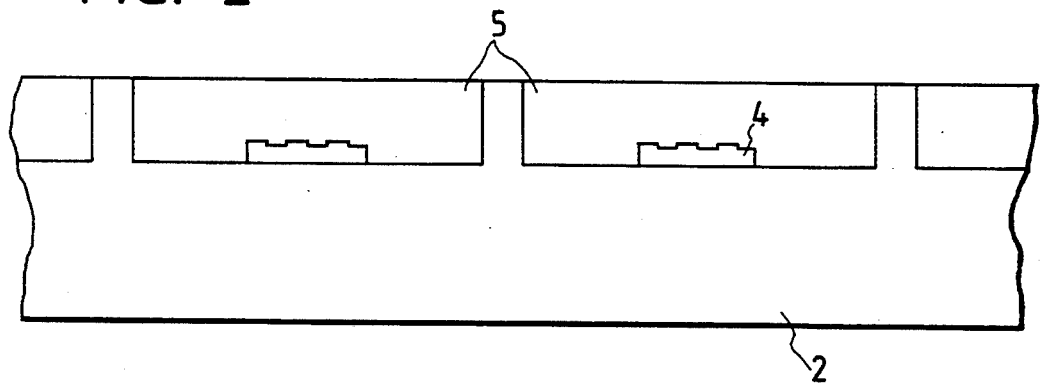
FIG. 2 is a schematic diagram for illustration of an example when embedding grown single crystals internally on a substrate.

Also, when a concavity with a desired size is formed on the substrate, a nucleation surface 4 shown in FIG. 2 is formed at the central portion thereof and the same crystal growth is applied, finally. A structure with the single crystal region being separated by the insulating material of the substrate 2 can be formed. Even if the crystal direction may differ slightly between the both crystals, single crystal islands with regular crystal directions of large area can be formed without occurrence of grain boundaries slightly differing in crystal direction as shown in FIG. 1D. This final state is shown in FIG. 2.

Formation of the nucleation surface having anisotropy (FIG. 1, nucleation surface 4) can be accomplished also by periodically varying the composition of the surface constituting substance, instead of the method of forming physical steps.

For formation of a nucleation surface in which the composition of the surface constituent substance is varied, for example, there are the method in which a mask member having a desired pattern provided on a film comprising a material having high nucleation density is provided and ions for varying the composition are implanted, and the method in which the ions for varying the composition are implanted with a focused ion beam to a desired pattern.

Examples are described in detail below.

EXAMPLE 1

On a glass substrate composed mainly of SiO$_2$ or an amorphous Si substrate was deposited an amorphous Si$_3$N$_4$ film to a thickness of 0.1 μm according to the reduced pressure CVD method. At this time, the growth temperature was made 800° C., and the pressure 0.3 Tort.

On the surface of said Si$_3$N$_4$ surface was formed a submicron grating pattern as described below. During that operation, holographic lithography and X-ray lithography were employed. Preparation of a mask for X-ray lithography was performed as described below.

A Si substrate was coated with a polyimide, a resist of AZ 1350B was coated thereon and an interference eddy of Ar ion laser (wavelength: 334 nm) was irradiated on the resist surface to form a grating with a period of 0.2 μm.

Then, in order to make a masking material for reactive metalizing, Cr was deposited by oblique metallizing on the grating head, O$_2$ ion etching to the polyimide surface was applied to deposit gold of the X-ray absorbing material in the direction vertical to the substrate, and the gold on the resist was removed by lift-off to form a grating pattern of gold with a period of 0.2 μm.

The Si substrate immediately beneath the polyimide was removed by wet etching to complete a mask for X-ray lithography.

Further, by use of this mask, a PMMA resist was coated on the Si$_3$N$_4$ film surface on the above-mentioned SiO$_2$, X-ray of Ck ray (wavelength: 4.5 nm) was irradiated to transfer the grating pattern onto the resist, and etching of 10 nm was applied on the Si$_3$N$_4$ film by reactive ion etching by use of CHF$_3$ gas to form a grating pattern with a depth of 10 nm and a period of 0.2 pm on the Si$_3$N$_4$ film surface.

Next, by use of conventional photolithography, the Si$_3$N$_4$ film having the grating thereon was separated and spotted on SiO$_2$ at intervals of 50 μm to complete a nucleation surface in lattice spots. In this Example, the shape of the nucleation surface was made a square of 2 μm×2 μm.

There is no inconvenience at all even if electron beam lithography, etc. may be employed as the fine structure forming method.

The substrate as described above was placed in a reduced pressure epitaxial growth device, and Si was deposited under the following conditions.

Pressure: 150 Tort
Gas: SiH$_2$Cl$_2$, HCl, H$_2$
Gas flow rate: SiH$_2$Cl$_2$, HCl, H$_2$ 0.53, 1.6, 100 (Q/min)
Temperature: 950° C.

As the initial stage of deposition, nucleus; of Si was deposited on the nucleation surface, single crystals were grown with lapse of time so as to cover over all the respective fine portions of Si$_3$N$_4$ film and until further the crystals grew to cover the SiO$_2$ substrate.

When growth was continued for about 90 minutes, Si single crystal islands were collided against adjacent Si islands to be integrated, whereby a continuous Si single crystal layer was obtained.

For examination of crystal defect, defect eliciting etching was applied on the growth layer surface, and as the result of examination by a scanning electron microscope, it was found that face defect (grain boundary with crystals slightly different in crystal direction) was found at the center between each artificial forming sites, namely the point where the islands were collided against each other, but other crystal defects were extremely few.

As the result of examination of the directions of a plurality of crystal islands sandwiching the plane defects as described above by electron channeling pattern, microprobe X-ray diffraction, it was confirmed that the [010] direction had grown in the substrate normal line direction at ±5° and [100] direction within the plane along the groove of surface of Si$_3$N$_4$ film grating within ±5° and the [001] direction within the plane in the direction perpendicular to the groove within the range of ±5°.

When a field effect transistor of conventional polysilicon gate was formed while avoiding the grain boundary where the crystals differed slightly in crystal direction, normal actuation to the same extent as the transistor prepared on conventional bulk Si wafer was exhibited, and an electron mobility of 350 cm$^2$/V-sec, sub-threshold characteristics of 95 mV/decay were exhibited.

EXAMPLE 2

On the whole amorphous Si$_3$N$_4$ film surface on the SiO$_2$ quartz glass was formed a grating with a period of 0.2 μm and a depth of 10 nm according to the method as shown in Example 1, and further a polycrystalline Si layer was deposited by reduced pressure CVD on the whole surface to a thickness of 150 nm under the conditions of a temperature of 620° C., a pressure of 0.3 Tort, followed by photolithography and etching so that Si layers and Si$_3$N$_4$ films could remain in square of 2 μm×2 μm at intervals of 50 μm, with the glass surface being exposed at other portions.

In this way, a substrate having polycrystalline Si layer formed at certain fine regions arranged in lattice shapes on a glass on the nucleation surface of the surface grating was prepared.

When said substrate was subjected to heat treatment in H$_2$ at 1000° C. for 5 minutes, fine polycrystalline Si of 2 μm×2 μm was agglomerated at a temperature lower than the melting point to be changed in structure to single crystal grains.

Further, when the crystals were permitted to grow under the same conditions as in Example 1, the agglomerated single crystal grains were increased in their sizes, until the adjoining crystal islands became collided and integrated to cover the whole sur face.

As the result of examination of this sample by cross-section and transmission electron microscopes, it was found that the crystal direction [010] was vertical to the substrate, and the [100] direction along the grating groove on Si$_3$N$_4$. As the result of observation of a large number of crystal islands, slippages of the respective directions were found to be about ±5°.

EXAMPLE 3

As described in Example 1, on a substrate having nucleation surfaces comprising an amorphous Si$_3$N$_4$ of 2 μm×2 μm engraved with grating with a period of 0.2 μm and a depth of 10 nm juxtaposed in lattices with internals of 20 μm on the surface of SiO$_2$, a polycrystalline Si was deposited by reduced pressure CVD on the whole surface with a thickness of 0.1 μm under the conditions of a temperature of 620° C. and a pressure of 0.3 Tort.

On the whole surface, Si ions were injected at an injection amount of $2 \times 10^{15}$ cm$^{-2}$ at 40 keV so that the projected flight distance could come to the center of the film thickness, thereby making the whole polycrystalline Si layer amorphous.

Then, the region where the Si$_3$N$_4$ film exists beneath said amorphous Si layer was covered with a resist, and further Si ions were injected into the whole surface in an amount of $2 \times 10^{15}$ cm$^{-2}$ at 70 keV.

SiO$_2$ ions were injected into the interface between the amorphous Si layer other than the portions where Si$_3$N$_4$ film exists and the subbing SiO$_2$, whereby nonuniform nucleus formation from the interface was inhibited.

After removal of the resist, when heat treatment was performed at 600° C. in N$_2$, solid phase growth of amorphous Si occurred on the nucleation surface comprising the amorphous Si$_3$N$_4$ to form a single crystal domain, while the port ion where Si ions were injected into the surrounding interface (namely on SiO$_2$) was inhibited in formation of nonuniform nucleus to remain as amorphous, and after the heat treatment of 50 hours, crystallization onto the amorphous Si region on SiO$_2$ proceeded as the crystals on Si$_3$N$_4$ as the seeds, whereby the whole was completely crystallized.

As the result of applying defect eliciting etching on the surface and observation by a scanning electron microscope, it was found that some crystals had a large number of twin crystals introduced therein, but a single crystal domain was formed with a size of 20 μm in diameter. When observed by a transmission electron microscope from the film plane direction, it was confirmed by reference of the electron beam diffraction image to the light vision field image that the [100] plane had grown in parallel to the substrate, whereby [100] had became substantially in parallel to the grating groove of Si$_3$N$_4$. The slippages in the crystal direction between the respective crystal domains were about ±10° in this case, and grain boundaries with crystals differing slightly in crystal direction were found to exist between Si$_3$N$_4$ sites.

When a field effect transistor was trially made on this crystal while avoiding the grain boundaries with crystals differing slightly in crystal direction, the electron mobility was found to be 150 cm$^2$/V-sec and sub-threshold characteristic to be 120 mV/decay.

As described above, Examples 1 to 3 employ Si$_3$N$_4$ as the nucleation surface, but as disclosed in Japanese Patent Laid-Open Application No. 63-107016, as the nucleation surface having high nucleation density, other than Si$_3$N$_4$ materials, the present invention is also applicable to SiO$_x$ and SiN$_x$ containing excessive Si, as a matter of course.

EXAMPLE 4

The foregoing three Examples controlled direction by engraving physical steps on the nucleation surface, but this Example is intended to introduce anisotropy by imparting periodically composition changes to the nucleation surface.

On a subbing material comprising amorphous SiO$_2$ was deposited an amorphous Si$_3$N$_4$ film by reduced pressure CVD on the whole surface to 100 nm, and after coating of a PMMA resist, a grating with a 0.2 μm period was transferred by X-ray lithography onto the resist. With said resist as the mask, Si ions were injected at 20 keV in an amount of $4 \times 10^{16}$ cm$^{-2}$.

After peel-off of the resist, the amorphous silicon nitride layer in which Si excessive regions exist periodically at intervals of 0.2 μm was permitted in spots on the lattice point positions of SiO$_2$ in squares of 2 μm × 2 μm at intervals of 50 μm.

The substrate was subjected to growth of Si internally of a reduced pressure CVD epitaxial growth device under the conditions of 150 Tort, 990° C., and the respective flow rates of SiH$_2$Cl$_2$, HCl, H$_2$ of 0.53, 1.6 and 100 (Q/min.), whereby nuclei of Si were generated only on the silicon nitride of 2 μm square, which became single crystals via the coarsening phenomenon, during which rearrangement of the atomic positions occurred to change the crystal direction according to the anisotropy of the subbing material.

Growth was continued also on SiO$_2$ with the group of crystals control led in direct ion, and contact and integration with the adjoining crystal islands occurred when growth had proceeded to about 50 μm.

As the result of detailed examination by transmission electron microscope and X-ray, the directions of said crystal islands were found to be grown such that the [010] direction was grown perpendicular to the substrate and the [100] direction in parallel to the Si excessive region, and there was a variance of ±7° between the respective islands. As the result, grain boundaries were found to be introduced between the respective islands.

What is claimed is:

1. A method for forming a crystal which comprises: conducting vapor phase crystal growth on a substrate which comprises (i) a non-nucleation surface; and (ii) a nucleation surface constituted of an amorphous material with a higher nucleation density than said non-nucleation surface, having a sufficiently small area so as to form only a single nucleus from which a single crystal is grown, and having a step whose width is 0.1 μm to 1.0 μm and whose depth is 0.01 μm to 0.1 μm.

2. A method for forming a crystal according to claim 1, wherein said nucleation surface has regular unevenness.

3. A method for forming a crystal according to claim 1, wherein said nucleation surface regularly has regions with a different composition.

4. A crystal article formed by the method for forming a crystal according to claim 1.

* * * * *

UNITED STATES PATENT AND TRADEMARK OFFICE
CERTIFICATE OF CORRECTION

PATENT NO. : 5,423,286

DATED : June 13, 1995

INVENTOR(S) : TAKAO YONEHARA

It is certified that error appears in the above-identified patent and that said Letters Patent is hereby corrected as shown below:

ON TITLE PAGE

In [56] References Cited, under U.S. PATENT DOCUMENTS:
   "Schwattke et al." should read --Schwuttke et al.-- and
   "Mitutani" should read --Mizutani--.

In [56] Referencences Cited, under OTHER PUBLICATIONS:
   Under "T. Yonehara, et al." (second occurrence),
   "Applies" should read --Applied-- and under D.A. Porter,
   et al., "Van Nostrond" should read --Van Nostrand--.

COLUMN 1

Line 50, "matching" should read --match--.

COLUMN 2

Line 16, "of" should read --into--.
   Line 17, "are" should read --is--.
   Line 21, "research does not exist" should read
            --these research areas is that both require--.
   Line 23, "ale" should read --a--.
   Line 28, "Generally," should read --Generally--.
   Line 34, "not" should be deleted.
   Line 35, "exists," should read --does not exist,--.
   Line 49, "of about" should read --on the order of--.
   Line 55, "ties" should read --ties,--.

COLUMN 3

Line 3, "is use" should read --use is--.
   Line 12, "surface." should read --surface exposed.--.

UNITED STATES PATENT AND TRADEMARK OFFICE
CERTIFICATE OF CORRECTION

PATENT NO. : 5,423,286

DATED : June 13, 1995

INVENTOR(S) : TAKAO YONEHARA

It is certified that error appears in the above-identified patent and that said Letters Patent is hereby corrected as shown below:

COLUMN 3

Line 16, "(so called" should read --(so-called--.
Line 29, "there is" should read --is there--.
Line 46, "vol. 12," should read --vol. 52,--.
Line 68, "(T. Yonchars," should read --(T. Yonehara,--.

COLUMN 4

Line 8, "(M.W. Gels," should read --(M.W. Geis,--.
Line 14, "and," should read --and--.
Line 17, "different" should read --differing--.
Line 26, "long" should read --many--.

COLUMN 5

Line 17, "boundaries existing," should read --boundaries,--.

COLUMN 6

Line 42, "applied, finally." should read --applied.--.

COLUMN 7

Line 4, "0.3 Tort." should read --0.3 Torr.--.
Line 16, "metalizing," should read --metallizing,--.
Line 31, "0.2 pm" should read --0.2 µm--.
Line 45, "150 Tort" should read --150 Torr--.
Line 47, "$H_2 0.53$," should read --$H_2$ 0.53,--.
Line 48, "(Q/min)" should read --(l/min.)--.
Line 50, "nucleus;" should read --nucleus--.
Line 53, "further" should be deleted.

UNITED STATES PATENT AND TRADEMARK OFFICE
CERTIFICATE OF CORRECTION

PATENT NO. : 5,423,286
DATED : June 13, 1995
INVENTOR(S) : TAKAO YONEHARA

It is certified that error appears in the above-identified patent and that said Letters Patent is hereby corrected as shown below:

COLUMN 8

```
Line 6,  "[100]" should read --the [100]--.
Line 26, "0.3 Tort," should read --0.3 Torr,--.
Line 44, "sur face." should read --surface.--.
Line 58, "internals" should read --intervals--.
Line 63, "0.3 Tort." should read --0.3 Torr.--.
```

COLUMN 9

```
Line 15, "port ion" should read --portion--.
Line 32, "[100]" should read --the [100]--.
Line 33, "had became substantially in" should read
         --plane becomes substantially--.
```

COLUMN 10

```
Line 17, "150 Tort," should read --150 Torr,--.
Line 19, "(Q/min.)," should read --(l/min.),--.
Line 26, "control led" should read --controlled--.
```

Signed and Sealed this

Fourteenth Day of November, 1995

Attest:

BRUCE LEHMAN

*Attesting Officer*   Commissioner of Patents and Trademarks